(12) United States Patent
Ohno

(10) Patent No.: US 7,120,086 B2
(45) Date of Patent: Oct. 10, 2006

(54) SEMICONDUCTOR CIRCUIT (75) Inventor: Jun Ohno, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 34 days.

(21) Appl. No.: 10/893,490

(22) Filed: Jul. 19, 2004

(65) Prior Publication Data
US 2005/0212555 A1 Sep. 29, 2005

(30) Foreign Application Priority Data
Mar. 26, 2004 (JP) .............................. 2004-091991

(51) Int. Cl.
G11C 5/00 (2006.01)
G11C 7/00 (2006.01)

(52) U.S. Cl. ...................... 365/233; 365/201; 365/226; 365/200

(58) Field of Classification Search ................ 365/201, 365/200, 96, 191
See application file for complete search history.

(56) References Cited
U.S. PATENT DOCUMENTS
4,800,332 A * 1/1989 Hutchins ................... 324/73.1

2002/0021592 A1* 2/2002 Nakaoka ..................... 362/200
2002/0080666 A1* 6/2002 Takahashi et al. .......... 365/200
2002/0080677 A1* 6/2002 Watanabe et al. ........... 365/233
2002/0191480 A1* 12/2002 Matsumoto et al. ........ 365/233
2003/0142545 A1* 7/2003 Imamiya et al. ........ 365/185.17

FOREIGN PATENT DOCUMENTS
JP 2000040393 A 2/2000

* cited by examiner

Primary Examiner—Vibol Tan
(74) Attorney, Agent, or Firm—Arent Fox PLLC

(57) ABSTRACT

A semiconductor circuit which includes one or plural fuse circuits being disconnectable and having a connected or disconnected state and a control circuit controlling a controlled circuit is provided. The control circuit controls the controlled circuit according to the state of the fuse circuit or the states of the fuse circuits when a normal mode is designated and controls the controlled circuit according to the state of the fuse circuit or the states of the fuse circuits and an input signal or input signals when a test mode is designated.

19 Claims, 8 Drawing Sheets

| TABLE NUMBER | EXTERNAL INPUT | | |
|---|---|---|---|
| | code2 | code1 | code0 |
| 0 | 0 | 0 | 0 |
| 1 | 0 | 0 | 1 |
| 2 | 0 | 1 | 0 |
| 3 | 0 | 1 | 1 |
| 4 | 1 | 0 | 0 |
| 5 | 1 | 0 | 1 |
| 6 | 1 | 1 | 0 |
| 7 | 1 | 1 | 1 |

| TABLE NUMBER | EXTERNAL INPUT | | | |
|---|---|---|---|---|
| | code3 | code2 | code1 | code0 |
| +7 | 0 | 0 | 0 | 0 |
| +6 | 0 | 0 | 0 | 1 |
| +5 | 0 | 0 | 1 | 0 |
| +4 | 0 | 0 | 1 | 1 |
| +3 | 0 | 1 | 0 | 0 |
| +2 | 0 | 1 | 0 | 1 |
| +1 | 0 | 1 | 1 | 0 |
| 0 | 0 | 1 | 1 | 1 |
| 0 | 1 | 0 | 0 | 0 |
| −1 | 1 | 0 | 0 | 1 |
| −2 | 1 | 0 | 1 | 0 |
| −3 | 1 | 0 | 1 | 1 |
| −4 | 1 | 1 | 0 | 0 |
| −5 | 1 | 1 | 0 | 1 |
| −6 | 1 | 1 | 1 | 0 |
| −7 | 1 | 1 | 1 | 1 |

SEMICONDUCTOR CIRCUIT

CROSS-REFERENCE TO RELATED APPLICATIONS

This application is based upon and claims the benefit of priority from the prior Japanese Patent Application No. 2004-091991, filed on Mar. 26, 2004, the entire contents of which are incorporated herein by reference.

BACKGROUND OF THE INVENTION

1. Field of the Invention

The present invention relates to a semiconductor circuit, and particularly relates to a semiconductor circuit including a fuse circuit.

2. Description of the Related Art

Semiconductor circuits are mass-produced by a manufacturing line. However, due to manufacturing variability in semiconductor circuits, variations in the characteristic values of respective semiconductor circuits occur. Therefore, after manufacturing, fuses are disconnected depending on their characteristic values to correct the characteristic values of the semiconductor circuits. So-called fuse trimming is performed.

The following Patent Document 1 discloses a semiconductor integrated circuit with fuse circuits.

(Patent Document 1)

Japanese Patent Application Laid-open No. 2000-040393.

SUMMARY OF THE INVENTION

An object of the present invention is to provide a semiconductor circuit capable of generating control signals by relatively shifting output signals of fuse circuits and controlling a controlled circuit according to the control signals in a test mode.

According to one aspect of the present invention, a semiconductor circuit which includes one or plural fuse circuits being disconnectable and having a connected or disconnected state and a control circuit controlling a controlled circuit is provided. The control circuit controls the controlled circuit according to the state of the fuse circuit or the states of the fuse circuits when a normal mode is designated and controls the controlled circuit according to the state of the fuse circuit or the states of the fuse circuits and an input signal or input signals when a test mode is designated.

DETAILED DESCRIPTION OF THE PREFERRED EMBODIMENTS

Figure 1:
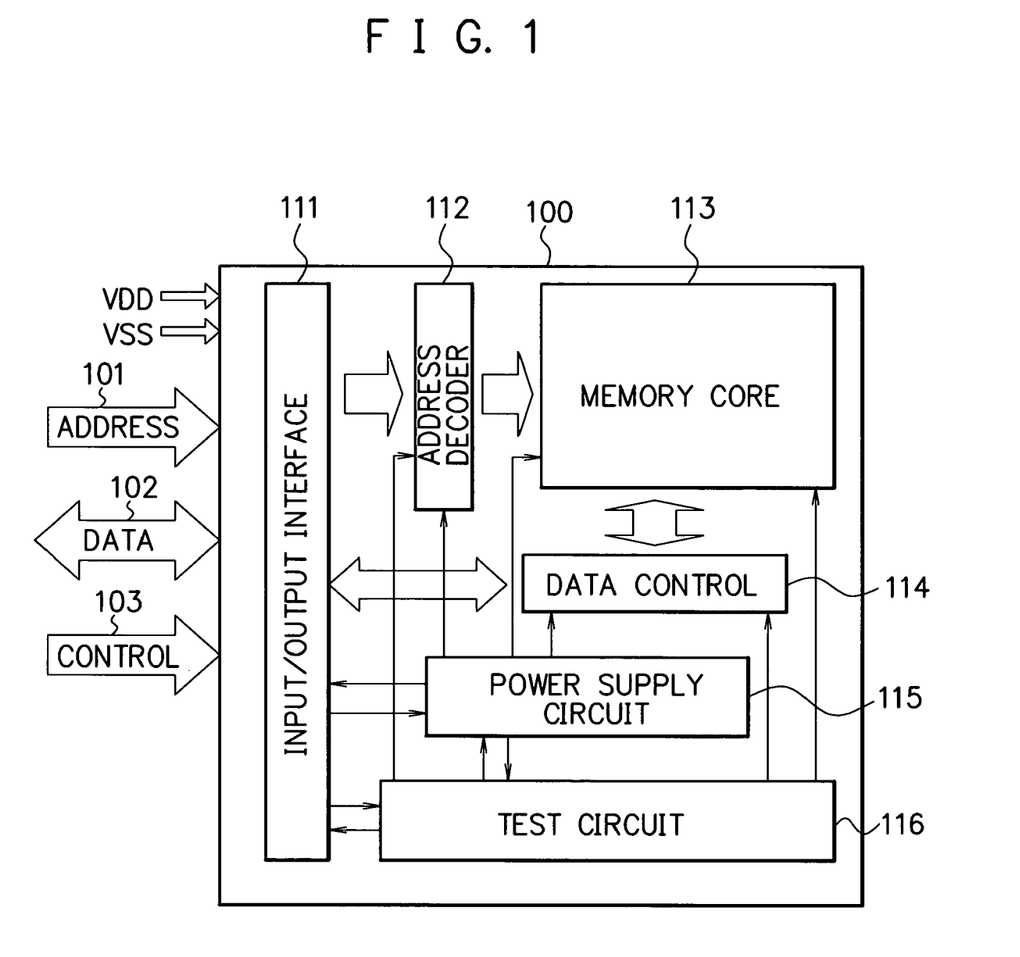
FIG. 1 is a block diagram showing an example of the configuration of a semiconductor memory circuit according to an embodiment of the present invention.

FIG. 1 is a block diagram showing an example of the configuration of a semiconductor memory circuit 100 according to an embodiment of the present invention. The semiconductor memory circuit 100 is constituted by one semiconductor chip and includes an input/output interface 111, an address decoder 112, a memory core 113, a data control circuit 114, a power supply circuit 115, and a test circuit 116. A power supply voltage VDD and a reference voltage (for example, a ground) VSS are supplied to the semiconductor memory circuit 100.

First, a write operation will be explained. In the write operation, a control signal 103 as a write command, an address signal 101 for write, and write data 102 are inputted to the semiconductor memory circuit 100. The address decoder 112 inputs the address signal 101 via the input/output interface 111, decodes the address signal 101, and outputs it to the memory core 113. The data control circuit 114 inputs the write data 102 via the input/output interface 111 and outputs it to the memory core 113. The memory core 113 includes plural memory cells in a two-dimensional array, selects a memory cell according to the decoded address signal, and writes the write data therein.

Next, a read operation will be explained. In the read operation, the control signal 103 as a read command and the address signal 101 for read are inputted to the semiconductor memory circuit 100. The address decoder 112 inputs the address signal 101 via the input/output interface 111, decodes the address signal 101, and outputs it to the memory core 113. The memory core 113 selects a memory cell according to the decoded address signal and reads data from this memory cell. The data control circuit 114 outputs the read data as the data 102 to the outside via the input/output interface 111.

The power supply circuit 115 generates a predetermined power supply voltage and supplies the power supply voltage to other circuit blocks. The control signal 103 contains a signal to designate a normal mode or a test mode. The normal mode is a mode after product shipment in which the aforementioned write operation and read operation can be performed. The test mode is a mode to carry out a test on the semiconductor memory circuit 100 by the test circuit 116 before product shipment. Its details will be described later.

Figure 2:
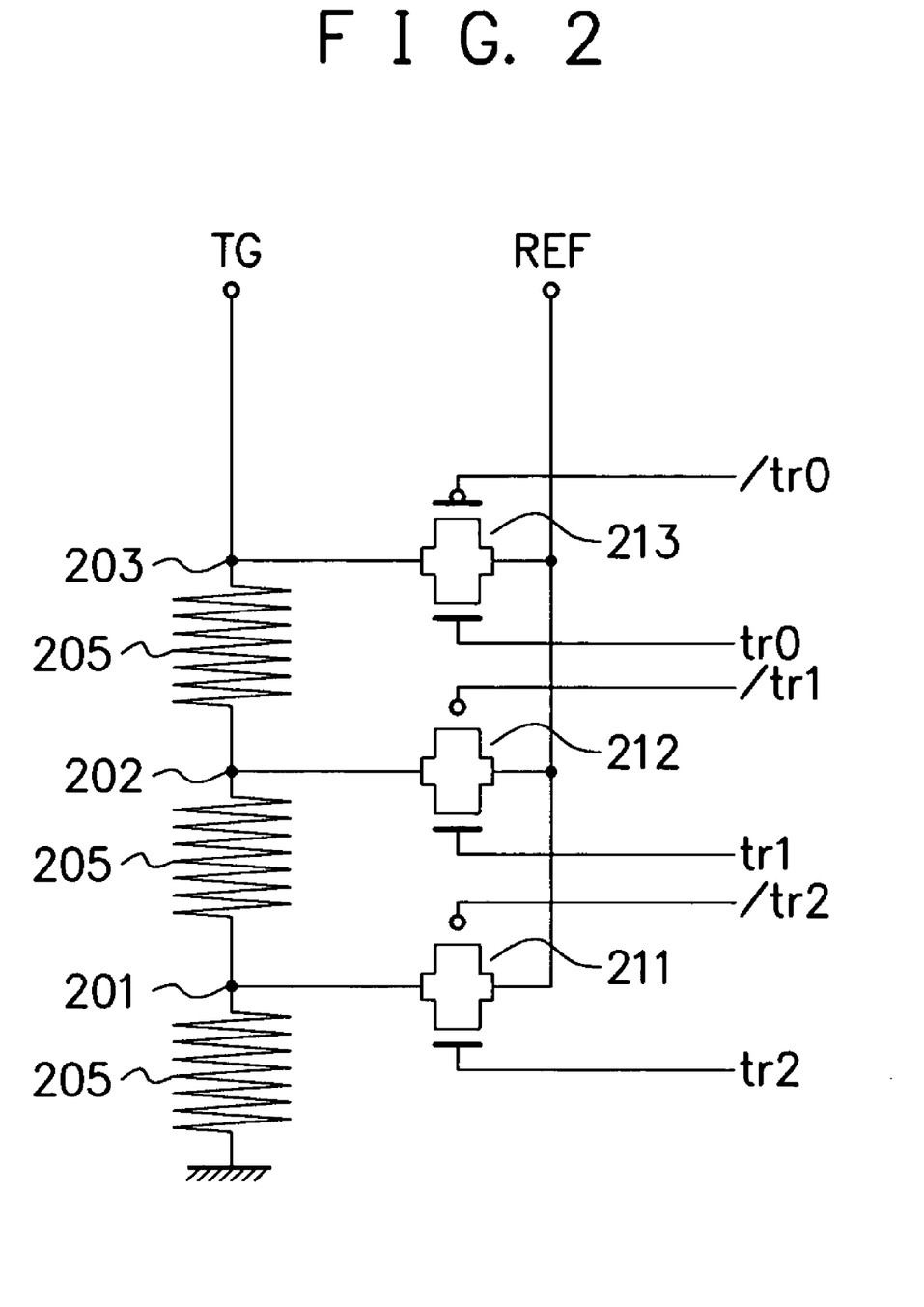
FIG. 2 is a circuit diagram showing an example of the configuration of a power supply circuit.

FIG. 2 is a circuit diagram showing an example of the configuration of the power supply circuit 115 in FIG. 1. For example, three resistances 205 are connected in series between a target voltage terminal TG and the reference voltage VSS. One resistance 205 is connected between a node 201 and the reference voltage VSS. Two series resistances 205 are connected between a node 202 and the reference voltage VSS. Three series resistances 205 are connected between a node 203 and the reference voltage VSS.

A transfer gate (switch) 213 connects or disconnects the node 203 and a reference voltage terminal REF according to control signals tr0 and /tr0. The control signals tr0 and /tr0 are mutually logically inverted signals. The symbol "/"

means a logical inversion symbol. The transfer gate 213 is composed of an n-channel MOS field effect transistor (FET) and a p-channel MOSFET. Sources and drains of the n-channel and p-channel MOSFETs are connected to each other. The control signal tr0 is connected to a gate of the n-channel MOSFET. The control signal /tr0 is connected to a gate of the p-channel MOSFET. For example, when the control signal tr0 is high and the control signal /tr0 is low, the n-channel and p-channel MOSFETs are turned on. As a result, the transfer gate 213 is brought into a connected state. On the other hand, when the control signal tr0 is low and the control signal /tr0 is high, the n-channel and p-channel MOSFETs are turned off. As a result, the transfer gate 213 is brought into a disconnected state.

Transfer gates 212 and 211 also have the same configuration as the transfer gate 213. The transfer gate 212 connects or disconnects the node 202 and the reference voltage terminal REF according to control signals tr1 and /tr1. The control signals tr1 and /tr1 are mutually logically inverted signals. The transfer gate 211 connects or disconnects the node 201 and the reference voltage terminal REF according to control signals tr2 and /tr2. The control signals tr2 and /tr2 are mutually logically inverted signals.

The reference voltage is supplied to the reference voltage terminal REF. However, since semiconductor memory circuits are mass-produced by a manufacturing line, reference voltages of respective semiconductor memory circuits differ due to manufacturing variability. This is caused, for example, by the occurrence of variations in a threshold voltage Vth of the MOSFET. Hence, Such a correction that the same target voltage (internal power supply voltage) is generated in the target voltage terminals of all the semiconductor memory circuits by closing only any one of three transfer gates 211 to 213 is made. For example, when a case where only the transfer gate 212 is closed is used as the reference, the voltage of the target voltage terminal TG can be made relatively high if only the transfer gate 211 is closed, and the voltage of the target voltage terminal TG can be made relatively low if only the transfer gate 213 is closed.

Figure 3:
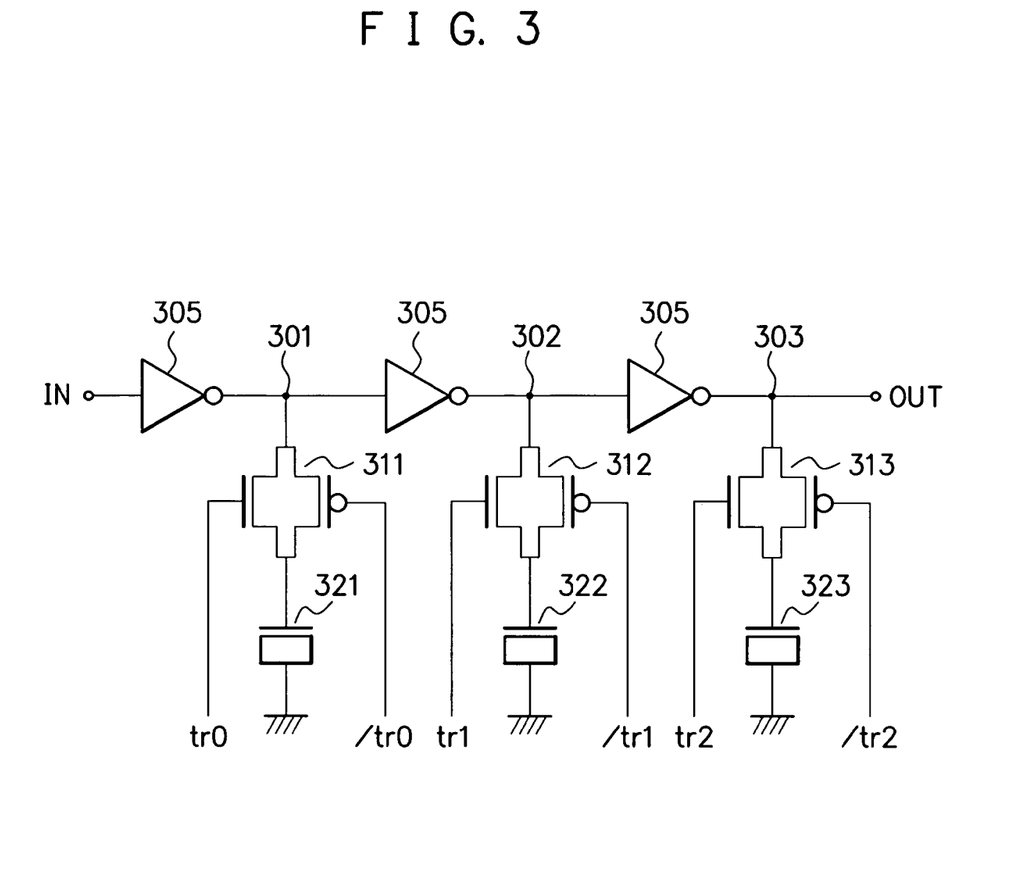
FIG. 3 is a circuit diagram showing an example of the configuration of a delay circuit.

FIG. 3 is a circuit diagram showing an example of the configuration of a delay circuit used in the semiconductor memory circuit 100 in FIG. 1. For example, three inverters 305 are connected between an input terminal IN and an output terminal OUT.

A transfer gate 311 connects or disconnects a node 301 and the reference voltage VSS with a capacitance 321 therebetween according to the control signals tr0 and /tr0. A transfer gate 312 connects or disconnects a node 302 and the reference voltage VSS with a capacitance 322 therebetween according to the control signals tr1 and /tr1. A transfer gate 313 connects or disconnects a node 303 and the reference voltage VSS with a capacitance 323 therebetween according to the control signals tr2 and /tr2. The capacitances 321 to 323 each can be formed, for example, by an n-channel MOSFET. An input signal inputted to the input terminal IN is delayed and outputted from the output terminal OUT.

Delay times of delay circuits differ from one semiconductor memory circuit to another due to manufacturing variability. Hence, it is possible to change the delay time by controlling the transfer gates 311 to 313 and make the delay times of the delay circuits of all the semiconductor chips on a wafer equal. The larger the values of the capacitances 321 to 323 connected to the delay circuit, the longer the delay time becomes.

Figure 4:
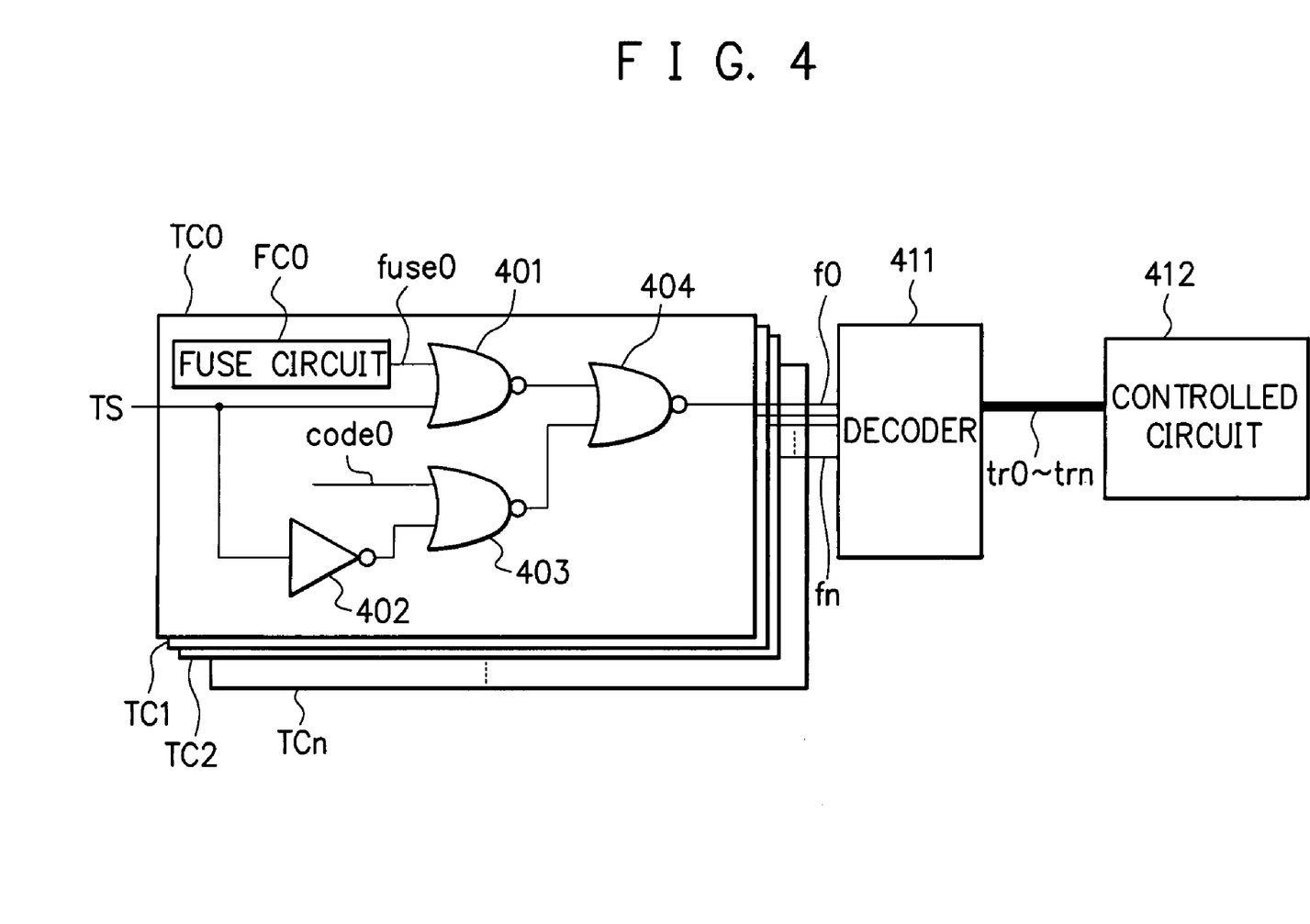
FIG. 4 is a circuit diagram showing an example of the configuration of a test circuit.

FIG. 4 is a circuit diagram showing an example of the configuration of the test circuit 116 in FIG. 1. A controlled circuit 412 is, for example, the power supply circuit in FIG. 2 or the delay circuit in FIG. 3. The test circuit 116 includes selection circuits TC0 to TCn and a decoder 411 and outputs control signals tr0 to trn and /tr0 to /trn.

The configuration of the selection circuit TC0 will be explained. A mode signal TS indicates a normal mode when it is 0 (low level) and indicates a test mode when it is 1 (high level). A fuse circuit FC0 can be disconnected by laser irradiation, has a connected or disconnected state, and outputs a fuse signal fuse0 of 1 or 0 according to its state. A test signal code0 is a signal inputted in place of the fuse signal fuse0 in the test mode. A negative logical sum (NOR) circuit 401 computes and outputs a NOR of the mode signal TS and the fuse signal fuse0. An inverter 402 outputs a signal obtained by logically inverting the mode signal TS. A NOR circuit 403 computes and outputs a NOR of the output signal of the inverter 402 and the test signal code0. A NOR circuit 404 computes a NOR of the output signals of the NOR circuits 401 and 403 and outputs a signal f0.

When the mode signal TS is 0 (in the normal mode), the signal f0 becomes the same as the fuse signal fuse0. On the other hand, when the mode signal TS is 1 (in the test mode), the signal f0 becomes the same as the test signal code0.

The decoder 411 decodes the signal f0 and outputs the control signals tr0 and /tr0. For example, when the signal f0 is 1, the control signal tr0 becomes 1 and the control signal /tr0 becomes 0. On the other hand, when the signal f0 is 0, the control signal tr0 becomes 0 and the control signal /tr0 becomes 1. The controlled circuit 412 is, for example, the power supply circuit in FIG. 2 or the delay circuit in FIG. 3, and controlled by the control signals tr0 and /tr0, and the like.

The selection circuits TC1 to TCn have basically the same configuration as the selection circuit TC0, include fuse circuits FC1 to FCn, respectively, in place of the fuse circuit FC0, input test signals code1 to coden, respectively, in place of the test signal code0 and output signals f1 to fn. The signals f1 to fn become the same signals as output signals fuse1 to fusen of the fuse circuits FC1 to FCn when the mode signal TS is 0 (in the normal mode), and becomes the same signals as the test signals code1 to coden when the mode signal TS is 1 (in the test mode). The decoder 411 decodes the signals f0 to fn and outputs control signals tr0 to trn and /tr0 to /trn to the controlled circuit 412.

Figure 5:
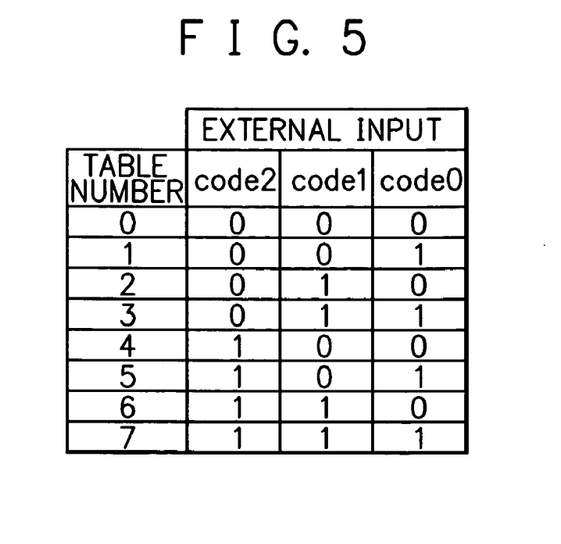
FIG. 5 is a table for designating test signals in FIG. 4.

FIG. 5 is a table for designating the test signals code0 to code2. When n is 2 in FIG. 4, the fuse circuits FC0 to FC2 have eight states. These eight states are associated with 3-bit table numbers 0 to 7. In the test mode, a 3-bit table number is designated from the outside. Thereby, the test signals code0 to code2 corresponding to the table number are inputted. In the test mode, the test signals code0 to code2 become the signals f0 to f2.

Figure 6:
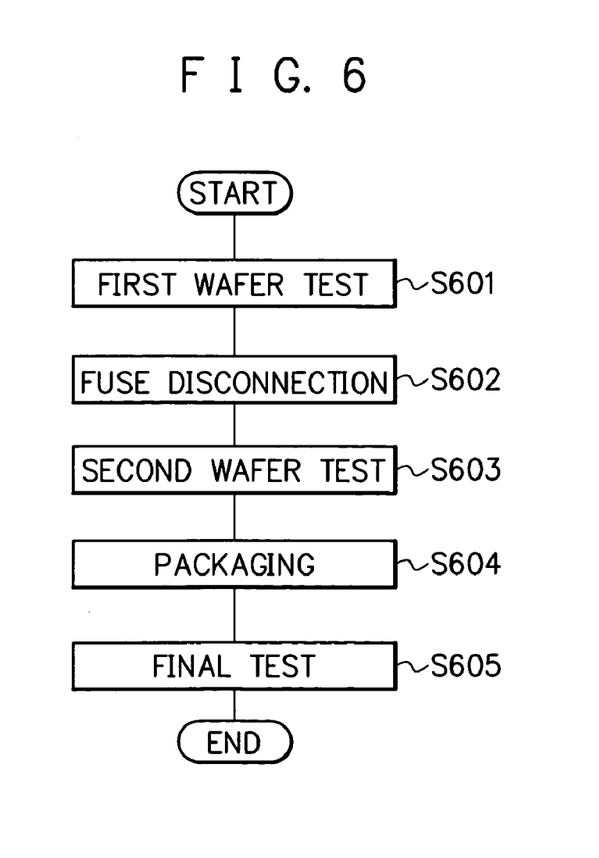
FIG. 6 is a flowchart showing the flow of tests until the semiconductor memory circuit is shipped.

FIG. 6 is a flowchart showing the flow of tests until the semiconductor memory circuit is shipped. In step S601, a first wafer test is carried out. The first wafer test is a test carried out at a stage when the semiconductor memory is formed on the semiconductor wafer. At this time, the fuse circuits FC0 to FCn are in a state where all fuses are connected, and, for example, variations in voltage (FIG. 2) and/or variations in delay time (FIG. 3) or the like is tested. This test is carried out by setting the mode signal TS to 1 (the test mode) and inputting the test signals code0 to coden.

Then, in step S602, fuse disconnection in the fuse circuits FC0 to FCn is performed according to the result of the aforementioned test. The fuse is disconnected by laser irradiation, and once it is disconnected, it is unrecoverable.

Thereafter, in step S603, a second wafer test is carried out in a state where the fuses are disconnected.

Subsequently, in step S604, plural semiconductor memory circuits on the semiconductor wafer are separated in units of a semiconductor chip and packaged.

Then, in step S605, a final test is carried out in a packaged state. If the final test is passed, the semiconductor memory circuit is shipped.

In the aforementioned tests in step S603 and S605, a case where a margin test for the controlled circuit 412 (FIG. 4) is carried out is considered. The margin test is carried out by, with reference to the states of the fuse circuits FC0 to FCn, relatively making a shift in a positive direction and a negative direction. The test is carried out, for example, by shifting the voltage in the power supply circuit in FIG. 2 and shifting the delay time in the delay circuit in FIG. 3.

In the margin test, it is possible only to set the mode signal TS to 1 (the test mode) and absolutely designate the voltage, the delay time, or the like by the test signals code0 to coden, and not possible to relatively shift the voltage, the delay time, or the like with reference to the current states of the fuse circuits FC0 to FCn. The states of the fuse circuits FC0 to FCn differ from one semiconductor memory circuit to another, whereby it is difficult to relatively shift the voltage or the delay time with reference to the states of the fuse circuit FC0 to FCn. A circuit to solve this problem will be explained with reference to FIG. 7.

Figure 7:
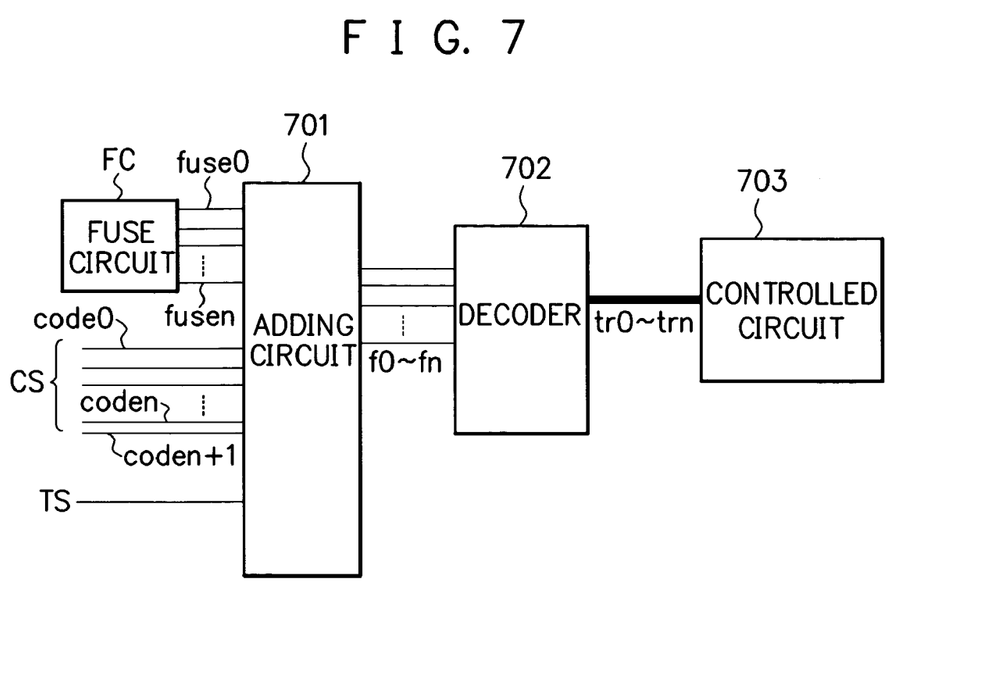
FIG. 7 is a circuit diagram showing an example of the configuration of the test circuit according to this embodiment.

FIG. 7 is a circuit diagram showing an example of the configuration of the test circuit (FIG. 1) according to this embodiment. A controlled circuit 703 is, for example, the power supply circuit in FIG. 2 or the delay circuit in FIG. 3. The test circuit 116 includes a fuse circuit FC, an adding circuit 701, and a decoder 702, and outputs control signals tr0 to trn and /tr0 to /trn. The adding circuit 701 and the decoder 702 constitute a control circuit.

The fuse circuit FC includes fuse circuits FC0 to FCn. The fuse circuits FC0 to FCn output n+1 bits of fuse signals fuse0 to fusen according to their respective fuse states. A test signal CS has n+2 bits of test signals code0 to coden+1 inputted from the outside and is one bit larger than the fuse signals fuse0 to fusen. The mode signal TS indicates a normal mode when it is 0 and indicates a test mode when it is 1.

The adding circuit (arithmetic circuit) 701 outputs the output signals fuse0 to fusen of the fuse circuits FC0 to FCn as they are as the signals f0 to fn when the mode signal TS is 0 (in the normal mode), and adds (computes) the output signals fuse0 to fusen of the fuse circuits FC0 to FCn and the test signals code0 to coden+1 and outputs the signals f0 to fn when the mode signal TS is 1 (in the test mode). An example thereof will be explained with reference to FIG. 9.

Figure 9:
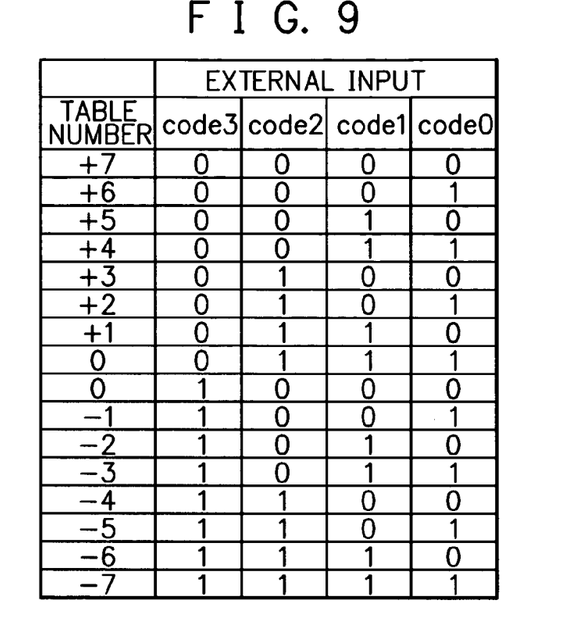
FIG. 9 is a table for designating test signals in FIG. 7.

FIG. 9 is a table for designating the test signals code0 to code3. In FIG. 7, a case where n is 2 is given as an example. Four bits of test signals code0 to code3 are associated with each of table numbers +7 to −7. Thereby, it becomes possible to relatively shift values of three bits of fuse signals fuse0 to fuse2 in a negative direction and a positive direction in a range from +7 to −7 and output the signals f0 to fn. Since the three bits of fuse signals fuse0 to fusen have eight states, the shift to all the eight states is possible if the shift range from +7 to −7 can be designated. Here, the most significant bit test signal code3 is a sign bit indicating a positive or negative direction in which the relative shift is performed. This means that the adding circuit 701 adds table numbers of the n+1 bits of fuse signals fuse0 to fusen and the n+2 bits of test signals code0 to coden+1 and outputs the signals f0 to fn.

As described above, when the mode signal TS is 0 (in the normal mode), the signals f0 to fn become the same as the fuse signals fuse0 to fusen. On the other hand, when the mode signal TS is 1 (in the test mode), the signals f0 to fn become signals obtained by adding the fuse signals fuse0 to fusen and the test signals code0 to coden+1.

The decoder 702 decodes the signals f0 to fn and outputs the control signals tr0 to trn and /tr0 to /trn. For example, when the signal f0 is 1, the control signal tr0 becomes 1 and the control signal /tr0 becomes 0. On the other hand, when the signal f0 is 0, the control signal tr0 becomes 0 and the control signal /tr0 is 1. The controlled circuit 703 is, for example, the power supply circuit in FIG. 2 or the delay circuit in FIG. 3, and controlled by the control signals tr0 and /tr0 or the like.

Figure 8:
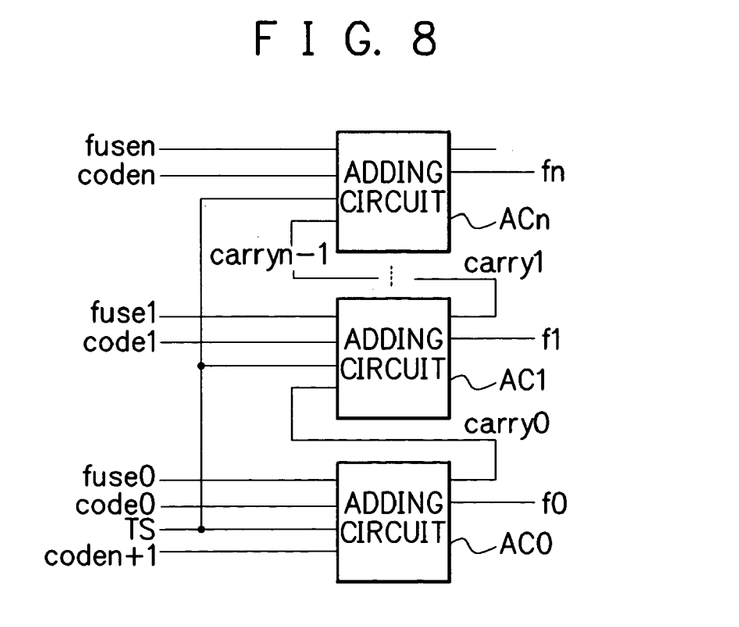
FIG. 8 is a block diagram showing an example of the configuration of an adding circuit.

FIG. 8 is a block diagram showing an example of the configuration of the adding circuit 701 in FIG. 7. The mode signal TS is inputted to n+1 adding circuits AC0 to ACn. The sign bit test signal coden+1 is inputted to a carry input terminal of the adding circuit AC0. In addition thereto, the least significant bit test signal code0 and the least significant bit fuse signal fuse0 are inputted to the adding circuit AC0. The adding circuit AC1 inputs the test signal code1, the fuse signal fuse1, and a carry signal carry0 of the adding circuit AC0. The adding circuit ACn inputs the test signal coden, the fuse signal fusen, and a carry signal carryn−1 of the adding circuit ACn−1.

First, a case where the mode signal TS is 0 (in the normal mode) will be explained. The adding circuits AC0 to ACn output the fuse signals fuse0 to fusen as they are as the signals f0 to fn.

Next, a case where the mode signal is 1 (in the test mode) will be explained. The adding circuit AC0 adds the sign bit coden+1, the fuse signal fuse0, and the test signal code0 and outputs the sum signal f0 and the carry signal carry0. The adding circuit AC1 adds the fuse signal fuse1, the test signal code1, and the carry signal carry0 and outputs the sum signal f1 and the carry signal carry1. The adding circuit ACn adds the fuse signal fusen, the test signal coden, and the carry signal carryn−1 and outputs the sum signal fn.

The case shown by the table in FIG. 9 will be explained as a more concrete example. The sign bit coden+1 (code3) is negative when it is 1 and positive when it is 0. When the sign bit coden+1 is 1, a subtraction is performed, and when the sign bit coden+1 is 0, an addition is performed. The adding circuit AC0 adds the sign bit coden+1, the fuse signal f0, and the test signal code0. The adding circuit AC1 adds the fuse signal f1, the test signal code1, and the carry signal carry0. The adding circuit ACn adds the fuse signal fn, the test signal coden, and the carry signal carryn−1.

According to this embodiment, in the test in step S603 or S605 in FIG. 6, the margin test for the controlled circuit 703 can be carried out. Namely, the margin test can be carried out by, with reference to the states of the fuse circuits FC0 to FCn, relatively making a shift in a positive direction or a negative direction. For example, it is possible to carry out the test by shifting the voltage in the power supply circuit in FIG. 2 and shifting the delay time in the delay circuit in FIG. 3.

Incidentally, the wafer test in step S601 in FIG. 6 is carried out before the fuse disconnection (S602) and all the fuses in the fuse circuits FC0 to FCn are in the connected state. Accordingly, it is possible to designate signals which are relatively shifted by the test signals code0 to coden+1 with reference to the above state. Namely, it is possible to absolutely designate the voltage, the delay time, or the like. Moreover, it is also possible to have two modes of absolute designation and relative designation.

Figure 10:
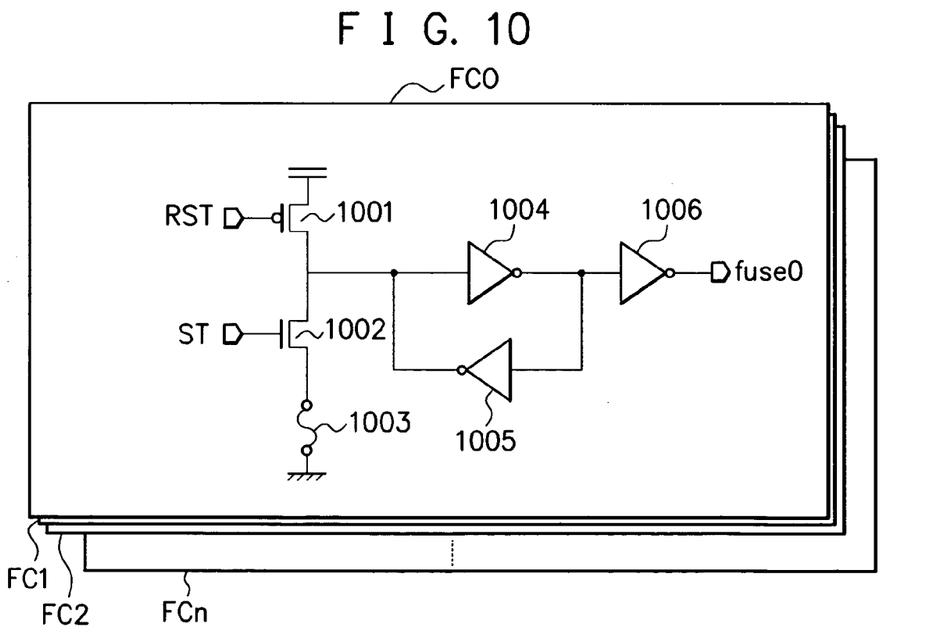
FIG. 10 is a circuit diagram showing an example of the configuration of a fuse circuit.
Figure 11:
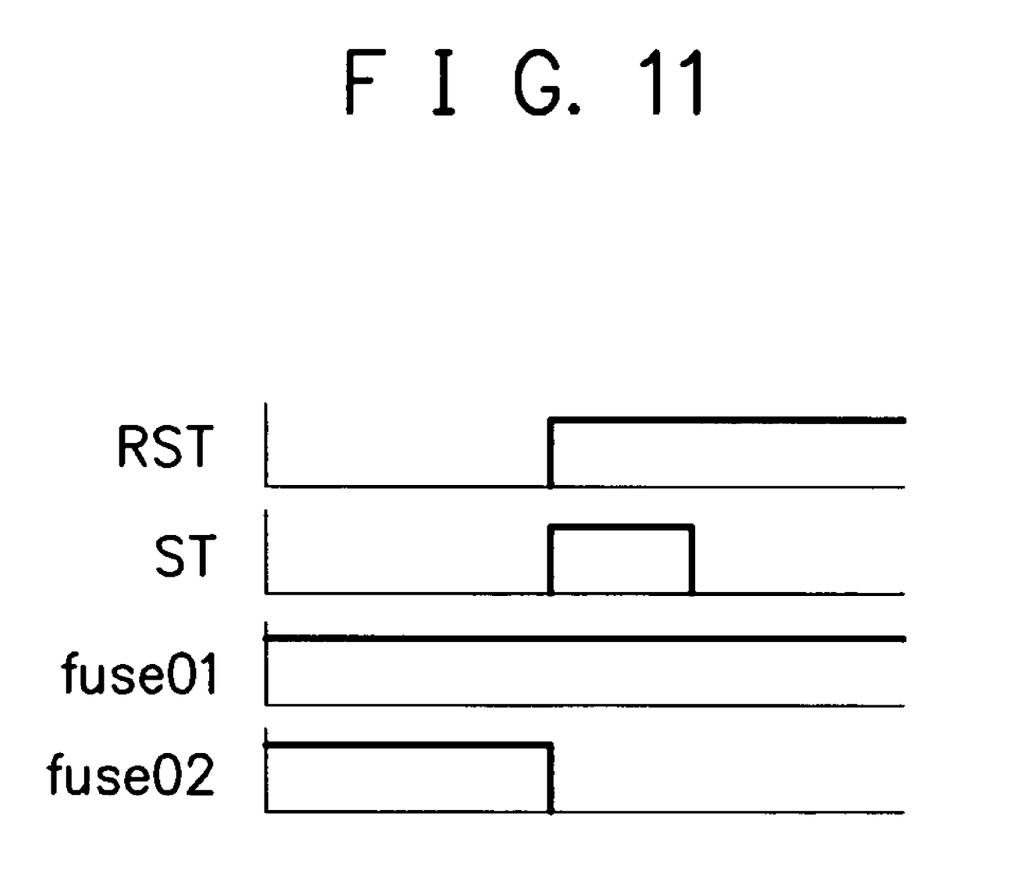
FIG. 11 is a timing chart for explaining the operation of the fuse circuit.

FIG. 10 is a circuit diagram showing an example of the configuration of each of the fuse circuits FC0 to FCn, and FIG. 11 is a timing chart for explaining the operation thereof. All the fuse circuits FC0 to FCn have the same configuration and differ only in the state of a fuse 1003. A p-channel MOSFET 1001 has a gate connected to a reset signal RST, a source connected to the power supply voltage, and a drain connected to a drain of an n-channel MOSFET 1002. The n-channel MOSFET 1002 has a gate connected to a set signal ST, a source connected to the reference voltage via the fuse 1003. The fuse 1003 is a current-carrying line which can be disconnected by laser irradiation.

An inverter 1004 has an input terminal connected to an interconnection point between the drains of the MOSFETs 1001 and 1002 and an output terminal connected to an input terminal of an inverter 1006. An inverter 1005 has an input terminal connected to the output terminal of the inverter 1004 and an output terminal connected to the input terminal of the inverter 1004. The inverter 1006 logically inverts an input signal and outputs the fuse signal fuse0.

In FIG. 11, a fuse signal fuse01 indicates the fuse signal fuse0 when the fuse 1003 is in a disconnected state, and a fuse signal fuseO2 indicates the fuse signal fuse0 when the fuse 1003 is in a connected state.

First, the fuse signal fuse01 when the fuse 1003 is in the disconnected state will be explained. After power-on, the MOSFET 1001 is turned on and the MOSFET 1002 is turned off when the reset signal RST and the set signal ST are low. As a result, a high-level input is applied to the inverter 1004, and the fuse signal fuse01 goes high. This state is held by memories of the inverters 1004 and 1005.

Thereafter, the reset signal RST and the set signal ST are driven high. Then, the MOSFET 1001 is turned off and the MOSFET 1002 is turned on. Since the fuse 1003 is disconnected, the states of the inverters 1004 and 1005 are not changed. As a result, the fuse signal fuse01 remains high.

Subsequently, the reset signal RST is held high, and the set signal ST is driven low. The MOSFETs 1001 and 1002 are turned off. The states of the inverters 1004 and 1005 are not changed, and the fuse signal fuse01 remains high.

Next, the fuse signal fuse02 when the fuse 1003 is in the connected state will be explained. After power-on, the MOSFET 1001 is turned on and the MOSFET 1002 is turned off when the reset signal RST and the set signal ST are low. As a result, a high-level input is applied to the inverter 1004, and the fuse signal fuse01 goes high. This state is held by the memories of the inverters 1004 and 1005.

Thereafter, the reset signal RST and the set signal ST are driven high. Then, the MOSFET 1001 is turned off and the MOSFET 1002 is turned on. Since the fuse 1003 is connected, a low-level input is applied to the inverter 1004. As a result, the fuse signal fuse02 changes to low level.

Subsequently, the reset signal RST is held high, and the set signal ST is driven low. The MOSFETs 1001 and 1002 are turned off. The states of the inverters 1004 and 1005 are not changed, and the fuse signal fuseO2 remains low.

As described above, when the fuse 1003 is in the disconnected state, the fuse signal fuse01 becomes 1 (high level), and when the fuse 1003 is in the connected state, the fuse signal fuse02 becomes 0 (low level).

Incidentally, the explanation is given with the power supply circuit in FIG. 2 and the delay circuit in FIG. 3 as examples of the controlled circuit 703 in FIG. 7, but the present invention is not limited to these examples. For example, the present invention is also applicable to a case where a cycle of a self-refresh operation of a DRAM is adjusted by a fuse circuit and the like. Moreover, the explanation is given with the semiconductor memory circuit as an example, but the present invention is not limited to this example but applicable to various kinds of semiconductor circuits.

As described above, according to this embodiment, when the normal mode is designated, the controlled circuit is controlled according to the states of the fuse circuits, and when the test mode is designated, the controlled circuit is controlled according to the states of the fuse circuits and the test signals (external input signals).

In the normal mode, the fuse signals fuse0 to fusen of the fuse circuits become the signals fuse0 to fusen as they are to control the controlled circuit. In the test mode, the controlled circuit is controlled according to the result of adding the fuse signals fuse0 to fusen of the fuse circuits and the test signals code0 to coden+1. In the test mode, it is possible to generate the control signals f0 to fn by relatively shifting the fuse signals fuse0 to fusen of the fuse circuits according to the test signals code0 to coden+1 and control the controlled circuit according to these control signals f0 to fn. Even if in the semiconductor circuits, the states of fuses are different from one semiconductor chip to another after fuse disconnection and the states of the fuses are unknown at the time of a test, in the controlled circuit, the margin test can be carried out by relatively sifting the control signals in the positive direction and the negative direction with reference to the states of the fuses. The same margin guarantee test can be carried out in all the semiconductor circuits.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

In the normal mode, the controlled circuit is controlled according to the states of the fuse circuits. In the test mode, the controlled circuit is controlled according to the states of the fuse circuits and the input signals. In the test mode, it is possible to generate the control signals by shifting the output signals of the fuse circuits according to the input signals and control the controlled circuit according to the control signals. After fuse disconnection, in the controlled circuit, the margin test can be carried out by relatively shifting the control signals in the positive direction and the negative direction with reference to the states of fuses.

What is claimed is:

1. A semiconductor circuit, comprising:
   one or plural fuse circuits being disconnectable and having a connected or disconnected state; and
   a control circuit controlling a controlled circuit according to the state of said fuse circuit or the states of said fuse circuits when a normal mode is designated and controlling the controlled circuit according to the state of said fuse circuit or the states of said fuse circuits and an input signal or input signals when a test mode is designated, wherein:
   said one or plural fuse circuits output plural bits of signals according to their states;
   said control circuit controls the controlled circuit according to the plural bits of output signals of said fuse circuits when the test mode is designated; and
   the number of bits of the input signals is larger than the number of bits output signals of the fuse circuits.

2. A semiconductor circuit, comprising:
   one or plural fuse circuits being disconnectable and having a connected or disconnected state; and a control circuit controlling a controlled circuit according to the state of said fuse circuit or the states of said fuse circuits when a normal mode is designated and controlling the controlled circuit according to the state of said fuse circuit or the states of said fuse circuits and an input signal or input signals when a test mode is designated, wherein:

said plural fuse circuits output plural bits of signals according to their states;

said control circuit controls the controlled circuit according to the plural bits of output signals of said fuse circuits when the test mode is designated; and said control circuit comprises an arithmetic circuit generating control signals by computing the output signals of the fuse circuits and the input signals when the test mode is designated and controls the controlled circuit according to the control signals.

3. The semiconductor circuit according to claim 2, wherein the arithmetic circuit generates the control signals by adding the output signals of the fuse circuits and the input signals when the test mode is designated.

4. The semiconductor circuit according to claim 2, wherein the arithmetic circuit outputs the output signals of the fuse circuits as the control signals when the normal mode is designated.

5. The semiconductor circuit according to claim 2, wherein said control circuit comprises a decoder decoding the control signals outputted by the arithmetic circuit and outputting the control signals to the controlled circuit.

6. The semiconductor circuit according to claim 2, wherein the arithmetic circuit generates the control signals by relatively shifting values of the output signals of the fuse circuits according to the input signals.

7. The semiconductor circuit according to claim 6, wherein the arithmetic circuit is allowed to generate the control signals by relatively sifting the values of the output signals of the fuse circuits in a positive direction and a negative direction according to the input signals.

8. The semiconductor circuit according to claim 7, wherein the number of bits of the input signals is larger than the number of bits of the output signals of the fuse circuits.

9. The semiconductor circuit according to claim 8, wherein a most significant bit of the input signals is a sign bit indicating the positive or negative direction in which the relative shift is performed.

10. A semiconductor circuit, comprising:
one or plural fuse circuits being disconnectable and having a connected or disconnected state; and
a control circuit controlling a controlled circuit according to the state of said fuse circuit or the states of said fuse circuits when a normal mode is designated and controlling the controlled circuit according to the state of said fuse circuit or the states of said fuse circuits and an input signal or input signals when a test mode is designated, wherein the controlled circuit is a power supply circuit whose voltage value is controlled according to said control circuit.

11. A semiconductor circuit, comprising:
one or plural fuse circuits being disconnectable and having a connected or disconnected state; and
a control circuit controlling a controlled circuit according to the state of said fuse circuit or the states of said fuse circuits when a normal mode is designated and controlling the controlled circuit according to the state of said fuse circuit or the states of said fuse circuits and an input signal or input signals when a test mode is designated, wherein the controlled circuit is a delay circuit whose delay time is controlled according to said control circuit.

12. The semiconductor circuit according to claim 3, wherein the arithmetic circuit outputs the output signals of the fuse circuits as the control signals when the normal mode is designated.

13. The semiconductor circuit according to 12, wherein the arithmetic circuit generates the control circuits by relatively shifting values of the output signals of the fuse circuits according to the input signals.

14. The semiconductor circuit according to claim 13, wherein the arithmetic circuit is allowed to generate the control signals by relatively sifting the values of the output signals of the fuse circuits in a positive direction and a negative direction according to the input signals.

15. The semiconductor circuit according to claim 14, wherein the number of bits of the input signals is larger than the number of bits of the output signals of the fuse circuits.

16. The semiconductor circuit according to claim 15, wherein a most significant bit of the input signals is a sign bit indicating the positive or negative direction in which the relative shift is performed.

17. The semiconductor circuit according to claim 16, wherein said control circuit comprises a decoder decoding the control signals outputted by the arithmetic circuit and outputting the control signals to the controlled circuit.

18. The semiconductor circuit according to claim 17, wherein the controlled circuit is a power supply circuit whose voltage value is controlled according to said control circuit.

19. The semiconductor circuit according to claim 17, wherein the controlled circuit is a delay circuit whose delay time is controlled according to said control circuit.

* * * * *